United States Patent [19]

Park

[11] Patent Number: 5,804,515
[45] Date of Patent: Sep. 8, 1998

[54] METHOD FOR FORMING CONTACT HOLES OF SEMICONDUCTOR DEVICE

[75] Inventor: Sang Kyun Park, Ichon-shi, Rep. of Korea

[73] Assignee: Hyundai Electronics Industries, Co., Ltd., Ichon-Shi, Rep. of Korea

[21] Appl. No.: 673,365

[22] Filed: Jun. 28, 1996

[30] Foreign Application Priority Data

Jun. 30, 1995 [KR] Rep. of Korea .................. 1995-18888

[51] Int. Cl.$^6$ ................................... H01L 21/00
[52] U.S. Cl. ..................... 438/700; 438/637; 438/670; 438/703; 438/760; 438/763
[58] Field of Search .................. 438/626, 631, 438/760, 700, 703, 763, 702, 637, 670

[56] References Cited

U.S. PATENT DOCUMENTS

| | | |
|---|---|---|
| 4,879,253 | 11/1989 | Wakamatsu . |
| 5,238,878 | 8/1993 | Shinohara . |
| 5,268,333 | 12/1993 | Lee . |
| 5,270,236 | 12/1993 | Rosner . |
| 5,286,681 | 2/1994 | Maeda . |
| 5,384,276 | 1/1995 | Ogawa . |
| 5,426,067 | 6/1995 | Ogawa . |
| 5,514,625 | 5/1996 | Tsuji . |
| 5,552,342 | 9/1996 | Itou . |

OTHER PUBLICATIONS

WPIDS–95–112054 abstract of JP07037877, Feb. 7, 1995.

*Primary Examiner*—Gary Geist
*Assistant Examiner*—Jean F. Vollano
*Attorney, Agent, or Firm*—Reid & Priest LLP

[57] ABSTRACT

A method for forming contact holes of a semiconductor device, capable of preventing a photoresist film pattern used as a contact hole mask separating from a boro-phospho silicate glass (BPSG) film disposed of beneath the photoresist film pattern due to an over-etching of the BPSG film occurring when the BPSG film is wet etched. The method includes sequentially laminating a thin insulating film and a planarizing BPSG film over a semiconductor substrate, thermally treating the BPSG film at a temperature ranging from 80° C. to 350° C. and depositing a photoresist film over the BPSG film in a continuous manner with the same equipment used in the thermal treatment, removing a desired portion of the photoresist film, thereby forming a photoresist film pattern, wet etching an exposed portion of the BPSG film not covered with the photoresist film pattern to a desired depth, and dry etching the remaining BPSG film along with the insulating film, thereby forming contact holes. The thermal treatment of the heavily-doped BPSG film and the coating of the photoresist film are carried out in a continuous manner in the heat block of the same coating block. Accordingly, the adhesion of the photoresist film to the heavily-doped BPSG film is improved.

6 Claims, 2 Drawing Sheets

METHOD FOR FORMING CONTACT HOLES OF SEMICONDUCTOR DEVICE

BACKGROUND OF THE INVENTION

1. Field of the Invention

The present invention relates to a method for forming contact holes of a semiconductor device, and more particularly, to a method for forming contact holes of a semiconductor device which involves thermally treating a heavily-doped boro-phospho silicate glass (BPSG) film coated to provide a planarized surface and depositing a photoresist film over the BPSG film in a continuous manner in a heat block of the same coating track used in the thermal treatment.

2. Description of the Prior Art

In the fabrication of a semiconductor device with a highly integrated structure, irregularities are formed on the surface of the semiconductor device due to the high integration. As a result, the semiconductor device has a high topology. Such irregularities should be removed to reduce the high topology, thereby providing a planarized surface. The removal of the irregularities may be achieved by filling up the irregularities with an insulating film. In this connection, a planarizing method has been proposed which uses a BPSG film added with boron (B) and phosphor (P) in a high concentration. The BPSG film is coated over the surface of the semiconductor device with irregularities and then thermally treated at a high temperature, thereby planarizing the surface. Where such a BPSG film contains impurities in a concentration higher than a certain concentration, it may absorb moisture when it is exposed to the atmosphere. The absorbed moisture may adversely affect the micro pattern of the semiconductor device which determines its accuracy. In order to solve this problem, a method for curing such a BPSG film has also been proposed. This method involves a thermal treatment step to discharge the moisture absorbed in the BPSG film. However, this method did not take into consideration the effect resulting from a reaction of the BPSG film with the moisture remaining even after completing the thermal treatment step on the surface of the BPSG film. The remaining absorbed moisture reacts with the phosphor (P) of the BPSG film, producing phosphoric acid ($H_3PO_4$) on the surface of the BPSG film, thereby sharply degrading the adhesion of the photoresist film, which is subsequently coated on the BPSG film as a mask for the formation of metal contacts.

Now, an example of a conventional method for forming contact holes, which involves the above-mentioned BPSG film curing step, will be described below in conjunction with FIGS. 1A and 1B.

In accordance with this method, a patterned conductive layer 2 is first formed on a semiconductor substrate 1, as shown in FIG. 1A. Over the resulting structure, an insulating oxide film 3 is then deposited so as to prevent diffusion of impurities from occurring at subsequent steps. A BPSG film 4 is then deposited over the resulting structure. Subsequently, the BPSG film 4 is thermally treated, thereby providing a planarized surface.

Thereafter, a photoresist film is coated over the BPSG film 4, as shown in FIG. 1B. The photoresist film is then patterned in accordance with a light exposure and development process using a contact mask, thereby forming a photoresist film pattern 5. Using the photoresist film pattern 5 as a mask, the BPSG film 4 is wet etched to a desired depth at its portions not covered with the photoresist film pattern 5. Thereafter, the remaining portions of the BPSG film 4 and insulating oxide film 3 are dry etched until the semiconductor substrate 1 is exposed, thereby forming contact holes 8. The BPSG film 4 is wet and dry etched in a sequential manner in order to achieve an easy burial of contact metal into contact holes, which have a larger aspect ratio. With the wet etching, each contact hole gains a widened inlet.

However, when the BPSG film 4 is wet etched, the phosphor present at the surface of the BPSG film 4 reacts with moisture absorbed in the BPSG film 4, thereby causing the etchant solution to penetrate the interface between the BPSG film 4 and photoresist film pattern 5. As a result, the BPSG film 4 is over-etched.

Due to such an over-etching, the absorbed moisture and phosphor degrade the adhesion of the photoresist film pattern 5 to the BPSG film 4. As a result, the neighboring contact holes 8 may come into contact with each other. The photoresist film pattern 5 may also detach from the BPSG film 4. Such phenomenons may result in a short circuit of the metal wiring of the semiconductor device. Otherwise, the photoresist film pattern 5 may collapse between neighboring contact holes 8. In this case, it is difficult to carry out the subsequent dry etching step. This is because the BPSG film is not etched to have a designed contour 4", but etched to have an instable contour 4' due to the degraded adhesion of the photoresist film pattern 5, as shown in FIG. 2.

SUMMARY OF THE INVENTION

Therefore, an objective of this invention is to solve the above-mentioned problems and to provide a method for forming contact holes of a semiconductor device, wherein a photoresist film is coated over a BPSG film after sufficiently removing moisture and phosphor contained in the BPSG film, so that the BPSG film can be etched to have a designed contour.

In accordance with the present invention, this objective is accomplished by providing a method for forming contact holes of a semiconductor device, comprising the steps of: forming a conductive layer pattern on a semiconductor substrate; sequentially laminating a thin insulating film and a planarizing boro phosphor silicate glass (BPSG) film over the resulting structure obtained after the formation of the conductive layer pattern; thermally treating the BPSG film at a temperature ranging from 80° C. to 350° C. to remove moisture from the atmosphere absorbed in the surface portion of the BPSG film when the BPSG film is exposed to the atmosphere along with a phosphor present at the surface portion of the BPSG film and depositing a photoresist film over the BPSG film in a continuous manner with the same equipment used in the thermal treatment; removing a desired portion of the photoresist film, thereby forming a photoresist film pagwern; wet etching an exposed portion of the BPSG film not covered with the photoresist film pattern to a desired depth; and dry etching the remaining BPSG film along with the insulating film, thereby forming contact holes.

The thermal treatment of the BPSG film and the coating of the photoresist film are carried out in a continuous manner in the heat block of the same coating block. Accordingly, the adhesion of the photoresist film to the BPSG film is improved. Accordingly, the BPSG film can be wet etched to have a designed contour.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1A:
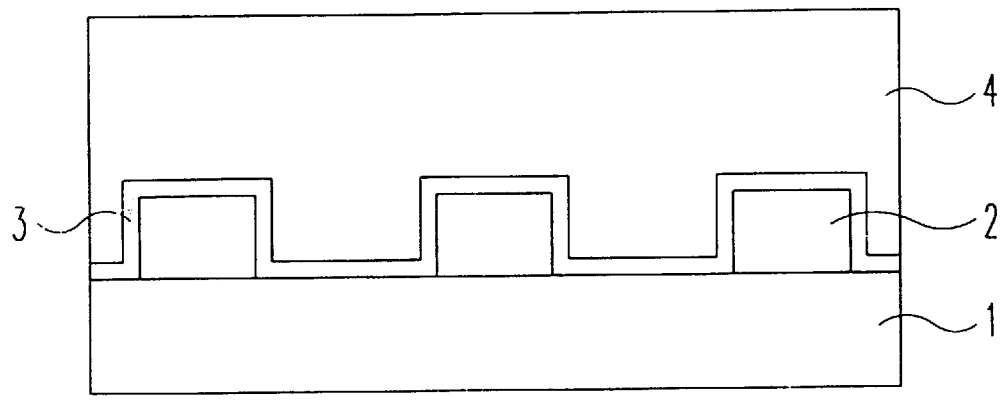
FIGS. 1A and 1B are sectional views respectively illustrating a conventional method for forming contact holes.
Figure 1B:
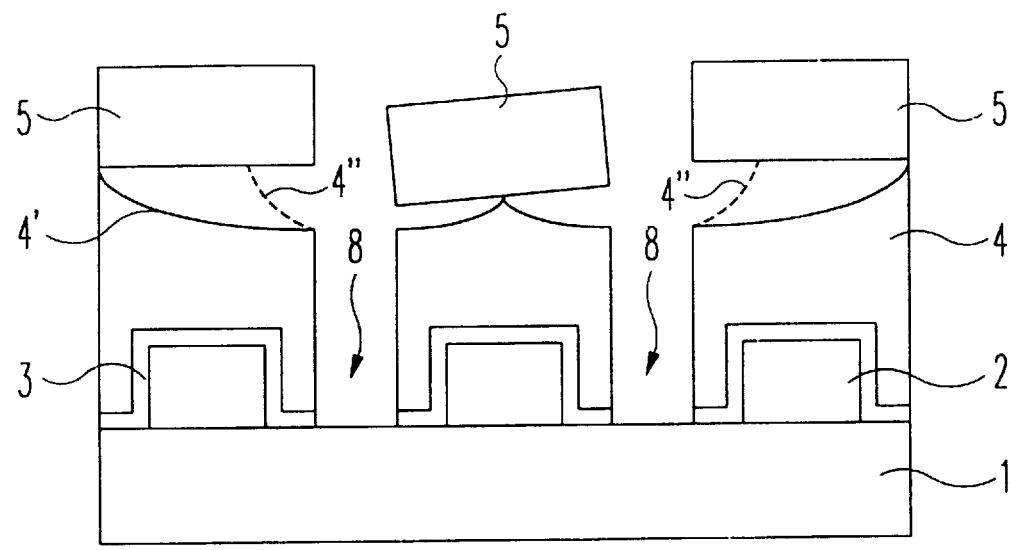
Figure 2A:
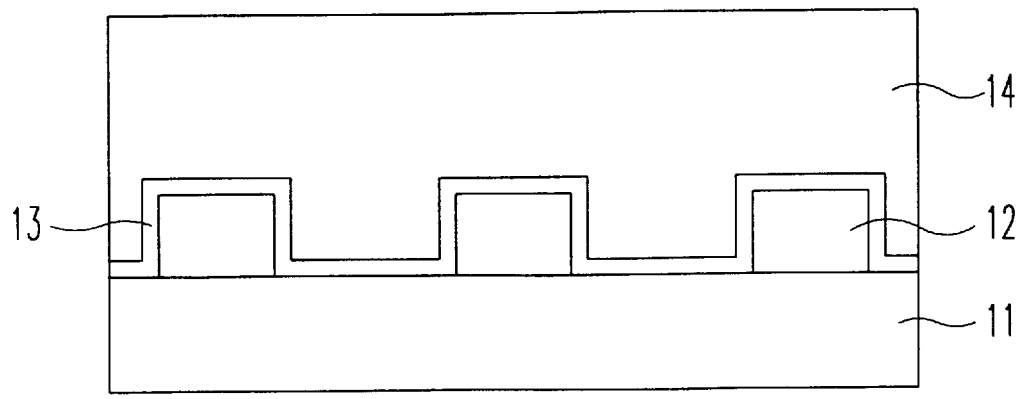
FIGS. 2A and 2B are sectional views respectively illustrating sequential steps of a method for forming contact holes of a semiconductor device in accordance with an embodiment of the present invention.
Figure 2B:
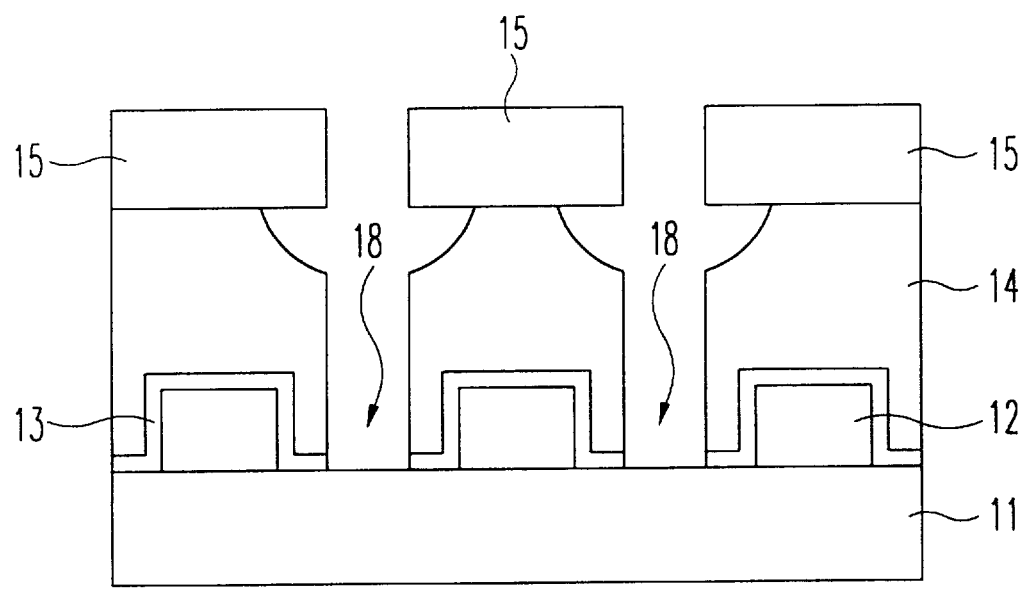

FIGS. 2A and 2B illustrate sequential steps of a method for forming contact holes of a semiconductor device in accordance with an embodiment of the present invention.

In accordance with the method of the present invention, a semiconductor substrate 11 is first prepared, and a patterned conductive layer 12 is then formed on the semiconductor substrate 11, as shown in FIG. 2A. Over the resulting structure, a thin insulating oxide film 13 is then deposited so as to prevent diffusion of impurities from occurring in subsequent steps. A BPSG film 14 is then deposited over the resulting structure. Subsequently, the BPSG film 14 is thermally treated at a temperature of 800° to 900° C. in a nitrogen or oxygen atmosphere for 10 minutes or longer, thereby providing a planarized surface.

Thereafter, the resulting structure, namely, the wafer, is cooled in the atmosphere. While the wafer is cooled, moisture from the atmosphere is absorbed in the BPSG film 14. As a result, moisture and phosphor are present on the surface of the BPSG film 14.

The resulting wafer is then thermally treated at a temperature of 80° to 350° C. to remove the moisture and phosphor present on the surface of the BPSG film 14. Thereafter, the surface of the BPSG film 14 is treated using an enhancer for enhancing the adhesion of a photoresist film which will be coated over the BPSG film 14. For example, this treatment is carried out using an HMDS treatment. After completing the treatment using the enhancer, a photoresist film is coated to a desired thickness over the BPSG film 14, as shown in FIG. 2B. The photoresist film is then patterned in the same heater block of the same track used in the thermal treatment carried out before the HMDS treatment, thereby forming a photoresist film pattern 15 which will be used as a contact hole mask. Using the photoresist film pattern 15 as a mask, the BPSG film 14 is wet etched to a desired depth. Thereafter, the remaining portions of the BPSG film 14 and insulating oxide film 13 are dry etched until the semiconductor substrate 1 is exposed, thereby forming contact holes 18.

The thermal treatment for removing the moisture and phosphor present at the surface of the BPSG film may be carried out at a temperature of 150° to 350° C. Alternatively, the thermal treatment may involve three sequential treating steps, namely, the primary thermal treatment carried out at a temperature of 90° to 150° C., the secondary thermal treatment carried out at a temperature of 150° to 250° C. and the third thermal treatment carried out at a temperature of 250° to 350° C.

By thermally treating the BPSG film 14, the adhesion of the photoresist film pattern 15 to the BPSG film 14 is improved. As a result, the etchant solution used upon the wet etching does not penetrate the interface between the BPSG film 14 and photoresist film pattern 15. Accordingly, the wet etching is normally achieved.

As apparent from the above description, in accordance with the present invention, the BPSG film is thermally treated at a desired temperature before its wet etching. In accordance with the present invention, the coating of the photoresist film is performed in a continuous manner in the heater block of the coating block used in the thermal treatment. The adhesion of the photoresist film to the BPSG film is improved by the thermal treatment. Accordingly, it is possible to prevent the BPSG film from being over-etched at its side edges. It is also possible to prevent the photoresist film pattern from separating from the BPSG film. As a result, an improvement in productivity is achieved.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed:

1. A method of forming contact holes in a semiconductor device, comprising:

forming a conductive layer pattern on a semiconductor substrate;

sequentially depositing a thin insulating film and then a BPSG film over the resulting structure;

cooling the resulting structure in the atmosphere;

thermally treating the cooled BPSG film at a temperature raging from 80° C. to 350° C. to remove moisture absorbed from the atmosphere and phosphorus present at the surface of the BPSG film;

coating a photoresist film over the BPSG film with the same equipment used in the thermally treating step;

removing portions of the photoresist film to form a photoresist film pattern;

wet-etching, to a desired depth, a portion of the BPSG film that is not covered by the photoresist film pattern; and dry-etching remaining portions of the BPSG film and insulating film to form the contact holes.

2. The method of claim 1, further comprising:

planarizing the surface of the deposited BPSG film by thermally treating it at a temperature ranging from 800° C. to 900° C.

3. The method of claim 2, wherein:

the planarizing step is carried out in a nitrogen atmosphere for at least ten minutes.

4. The method of claim 2:

the planarizing step is carried out in an oxygen atmosphere for at least ten minutes.

5. The method of claim 1, wherein the step of thermally treating the cooled BPSG film includes:

first, thermally treating the BPSG film at a temperature ranging from 90° C. to 150° C.;

second, thermally treating the BPSG film at a temperature ranging from 150° C. to 250° C.; and third, thermally treating the BPSG film at a temperature ranging from 250° C. to 350° C.

6. The method of claim 1, wherein the step of thermally treating the cooled BPSG film includes a single step of:

thermally treating the BPSG film at a temperature ranging from 150° C. to 350° C.

* * * * *